Feb. 7, 1961 R. W. ALLEN ET AL 2,971,162
AMPLITUDE BALANCE CIRCUIT
Original Filed Aug. 4, 1954
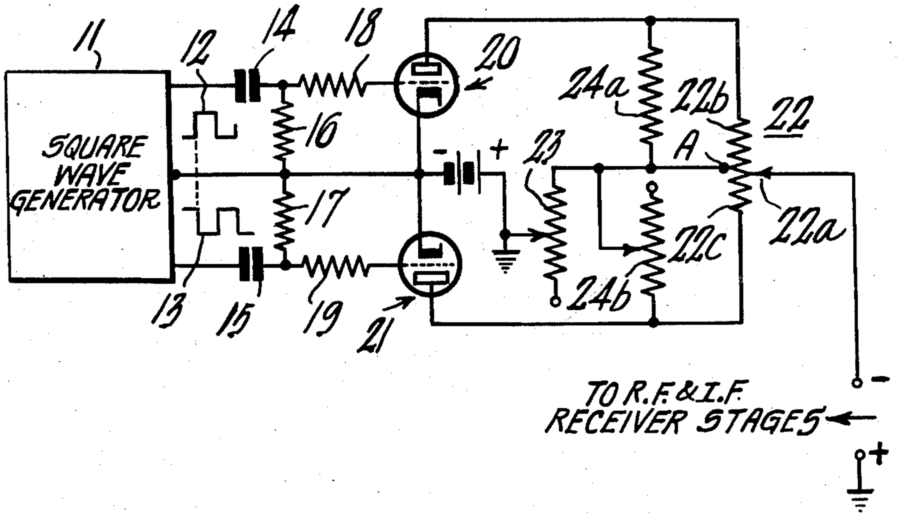
INVENTORS
JAY J. AYRES
RICHARD W. ALLEN
BY J. C. Whittaker
ATTORNEY United States Patent Office 2,971,162

Patented Feb. 7, 1961

2,971,162

AMPLITUDE BALANCE CIRCUIT

Richard W. Allen, Moorestown, and Jay J. Ayres, Washington Township, Gloucester County, N.J., assignors to Radio Corporation of America, a corporation of Delaware Continuation of application Ser. No. 447,788, Aug. 4, 1954. This application Mar. 18, 1958, Ser. No. 722,352

4 Claims. (Cl. 330—116)

This application is a continuation of application 37,394, Serial No. 447,788, filed August 4, 1954, now abandoned.

The present invention relates generally to differential signal gain control systems and particularly to an improved differential amplitude balance circuit which is useful in loran receiving equipment.

In conventional loran receivers master and slave loran pulses are received during separate reception intervals, and amplified in a time sharing amplifier such that the gain of the receiver may be separately adjusted for slave and master pulses. During the reception of the stronger of the received pulses the receiver gain is reduced to attenuate these pulses by applying a portion of a square wave thereto as a gain control bias.

In loran gain control circuits it is essential that the positive half of the square wave gain control bias supplied to the receiver be clamped to the receiver bias level in order that the weaker loran pulse may be received under optimum receiving conditions. A shunt diode used as a D.-C. restorer is unsatisfactory for the purpose because appreciable changes in D.-C. clamping level occur due to the diode resistance. A series diode circuit has the disadvantage of long recovery time of the bias adjustment. Keyed diode clampers require extra tubes and more complicated circuitry.

It is an object of the present invention to provide an improved signal gain or amplitude balance control system having none of the foregoing disadvantages and yet which is relatively simple and inexpensive.

Another object is to provide an improved system for differentially controlling both the relative magnitudes and absolute magnitudes of a plurality of electrical signals.

A typical embodiment of a bias control circuit in accordance with the invention comprises a push-pull amplifier including a pair of amplifying devices having their output circuits coupled to opposite ends of a potentiometer, the center tap of which is connected to a source of reference potential. The amplifying devices are alternately driven to cutoff by alternate half cycles of a square wave input signal. A constant voltage output bias signal is derived from the potentiometer movable contact when it coincides with the center tap. When the contact is moved in either direction from the center tap the amplitude and phase of the amplifier square wave output bias voltage changes, the amplitude depending upon the relative positions of the center tap and potentiometer arm and the phase depending upon the direction of displacement of the potentiometer arm from the center tap.

In a preferred embodiment of the invention the potential of the center tap may be adjusted by a second potentiometer thus adjusting the quiescent bias level of the receiver during the reception of the weaker loran pulse.

In the preferred embodiment of the invention the push-pull amplifier is also provided with means for compensating for differences in amplifying devices so that replacement of a burned-out amplifying device with a new one will not affect circuit performance.

The foregoing and other objects, advantages and novel features of the invention will be more fully described in connection with the accompanying drawing the single figure of which is a schematic circuit diagram of a typical amplitude balance circuit in accordance with the present invention.

Referring to the drawing, a square wave generator 11 supplies a pair of oppositely phased square waves 12, 13. It is understood that when used in a loran receiving system the square wave has a period L equal to the loran pulse period and a half period L/2. One of the square waves 12 is coupled to the input (grid-cathode) circuit of a first amplifier tube 20 through a network including coupling capacitor 14, shunt resistor 16 and series resistor 18. The other square wave 13 is coupled to the input circuit of a second amplifier tube 21 through a similar network including coupling capacitor 15, shunt resistor 17 and series resistor 19.

The resultant push-pull amplifier output circuit includes a potentiometer 22 having a center tap A and a movable arm 22a. The center tap is connected to a point of reference potential, ground in the present circuit, through a second potentiometer 23. The circuit output derived from the movable arm 22a is supplied to gain control elements of the receiver radio frequency and intermediate frequency stages in order to control the gain of the receiver.

In operation, the square waves supplied to the input circuit of amplifier tubes 20 and 21 are of sufficient amplitude alternately to drive the tubes to cutoff. Resistors 18 and 19 limit the grid currents developed across shunt resistors 16 and 17. In this manner, triodes 20 and 21 act as switches, and minor variations on the input square waves such as loss of low frequency response due to the combination of condenser 14 and shunt resistor 16 and condenser 15 and shunt resistor 17 are not reflected in the output.

If both triodes conduct equal currents during their "on" interval, the potential at A is constant. The output signal, when arm 22a is set at any point on potentiometer section 22b, is negative with respect to tap A when triode 20 is conducting. When triode 20 is not conducting there is no current flow through potentiometer section 22b and therefore the potential of arm 22a at any point along potentiometer section 22b is the same as the potential at point A. Similarly, when triode 21 is conducting the output signal is negative with respect to A when arm 22a is set at any point on potentiometer section 22c. When triode 21 is not conducting there is no current flow through potentiometer section 22c and the potential at any point along the section is the same as that of point A. In both cases, the amplitude of the output square wave signal depends upon the relative position of arm 22a along section 22b or 22c and the output square wave taken from section 22b is always 180° out of phase with the output square wave taken from section 22c.

The setting of potentiometer 23 determines the potential at point A. Thus, when potentiometer 23 is adjusted to minimum value, point A is at ground potential and when it is adjusted to maximum value point A is at a maximum negative value, on the order of −20 to −25 volts in an embodiment of the invention actually constructed. Potentiometer 23 therefore adjusts the quiescent bias level of the receiver, that is, the bias level during the reception of the weaker of the loran signals. Potentiometer 23 may be thought of as a bias or gain control and potentiometer 22 as a balance control with perfect clamping to the bias level.

In a preferred embodiment of the invention in order to compensate for differences in tubes, shunt resistors 24a, 24b may be provided across potentiometer 22. Adjustment of the arm of resistor 24b will balance the triodes so that they conduct equally and provide the same potential at point A during both half cycles of square wave input.

Summarizing, the circuit described provides the desired time sharing balance control clamped to the gain setting used for the weaker received loran pulse without the use of clamping or D.-C. restoring diodes. The grids of two triodes are supplied with square waves 180° out of phase driving the triodes from zero to beyond cutoff. The output circuit of the triodes includes a potentiometer opposite ends of which are connected to the plates of the triodes. A fixed center tap on the potentiometer is returned to the value of bias desired for the reception of the weaker loran signal.

Although in the circuit described triode amplifiers are employed, it is to be understood that the circuit is equally applicable to the use of other amplifying devices such as tetrodes, pentodes or transistors.

What is claimed is:

1. In a hyperbolic navigation receiver of the type including a stage to which a gain control voltage may be applied for switching the receiver gain between two discrete levels, in combination, a pair of switch means, said switch means passing current when closed and not passing current when open, each having an input terminal and an output terminal; a potentiometer, opposite ends of which are connected to said output terminals, said potentiometer having a fixed center tap and a movable tap; means providing a reference potential; means for varying the voltage developed at said center tap including potentiometer means connected between said center tap and said means providing said reference potential; means connected to said input terminals for alternately closing and opening said switches and passing substantially the same amounts of constant current through said switches during the respective intervals they are closed; and means for connecting said movable tap to said stage of said hyperbolic navigation receiver for controlling the gain of said stage in accordance with the voltage developed at said movable tap.

2. In a hyperbolic navigation receiver of the type including a stage to which a gain control voltage may be applied for switching the receiver gain between two discrete levels, in combination, a push-pull amplifier including a pair of amplifying devices, a pair of input circuits, one connected to each of said devices, and an output circuit including a potentiometer the opposite ends of which are connected to said amplifying devices, and having a center tap and a movable tap; means for varying the voltage developed at said center tap including a second potentiometer connecting said center tap to a point of reference potential; square wave generating means connected to said pair of input circuits for supplying 180° out-of-phase square wave voltages thereto of sufficient amplitude alternately to drive said devices to cut off; and means for connecting said movable tap to said stage of said hyperbolic navigation receiver for controlling the gain of said receiver in accordance with the voltage developed at said movable tap.

3. The combination of a hyperbolic navigation receiver, the gain of which it is desired to switch between two discrete levels: and a circuit for producing a gain control voltage for said receiver, including a push-pull amplifier having a pair of amplifying devices, a pair of input circuits, one connected to each of said devices, and an output circuit including a potentiometer opposite ends of which are connected to said amplifying devices, and having a fixed center tap and a movable tap; means connecting said center tap to a point of reference potential; square wave generator means connected to said pair of input circuits for supplying like amplitude 180° out-of-phase square wave voltages thereto of sufficient amplitude alternately to drive said devices to cut off; and means connecting said movable tap to said receiver for applying a gain control voltage thereto.

4. In the combination as set forth in claim 3, further including means for adjusting the value of the voltage at said center tap, said means including a potentiometer connected between said center tap and said point of reference potential.

References Cited in the file of this patent

UNITED STATES PATENTS 2,651,033 Frantz ---------------- Sept. 1, 1953

FOREIGN PATENTS 142,366 Australia ---------------- July 23, 1951